(12) United States Patent
Mauchle et al.

(10) Patent No.: US 9,071,192 B2
(45) Date of Patent: Jun. 30, 2015

(54) OSCILLATOR FOR A POWDER SPRAY COATING DEVICE

(75) Inventors: Felix Mauchle, Abtwil (CH); Mario Vasella, Trubbach (CH)

(73) Assignee: GEMA SWITZERLAND GMBH, St. Gallen (CH)

( * ) Notice: Subject to any disclaimer, the term of this patent is extended or adjusted under 35 U.S.C. 154(b) by 17 days.

(21) Appl. No.: 13/985,349

(22) PCT Filed: Feb. 13, 2012

(86) PCT No.: PCT/US2012/024836
§ 371 (c)(1),
(2), (4) Date: Oct. 26, 2013

(87) PCT Pub. No.: WO2012/112429
PCT Pub. Date: Aug. 23, 2012

(65) Prior Publication Data
US 2014/0055205 A1 Feb. 27, 2014

(30) Foreign Application Priority Data

Feb. 14, 2011 (DE) .......................... 10 2011 004 026

(51) Int. Cl.
| B05B 5/10 | (2006.01) |
| H03B 7/00 | (2006.01) |
| B05B 5/00 | (2006.01) |
| B05B 5/03 | (2006.01) |

(52) U.S. Cl.
CPC *H03B 7/00* (2013.01); *B05B 5/006* (2013.01); *B05B 5/032* (2013.01); *B05B 5/10* (2013.01)

(58) Field of Classification Search
CPC ........................................................ B05B 5/10
USPC ................. 361/227, 228; 118/621; 363/21.17
See application file for complete search history.

(56) References Cited

U.S. PATENT DOCUMENTS

| 4,000,443 A | * | 12/1976 | Lever ............................ 361/228 |
| 5,506,746 A | | 4/1996 | Seitz |
| 5,735,958 A | | 4/1998 | Mauchle |

FOREIGN PATENT DOCUMENTS

| DE | 2915218 A1 | 10/1979 |
| DE | 19511255 A1 | 10/1996 |
| EP | 1 897 621 A2 | 3/2008 |

OTHER PUBLICATIONS

Corresponding German Application No. 10 2011 004 026.9 Examination Report dated Nov. 29, 2011.
Corresponding International Application PCT/US2012/024836 Written Opinion and Search Report dated May 15, 2012.

* cited by examiner

*Primary Examiner* — Joseph Chang
(74) *Attorney, Agent, or Firm* — Lowe Hauptman & Ham LLP (57) ABSTRACT

An oscillator (100) for providing an oscillating voltage for a powder spray coating device (200) is specified. With the aim of improving operational safety, the oscillator (100) as claimed in the invention has a first signal generator (10) for generating an intermediate circuit voltage (11), a second signal generator (20) for generating a modulation signal (21) and a modulation signal isolating element (61), connected to the second signal generator (20), while a first voltage monitoring device (60) is also provided, designed for continuously measuring the oscillator voltage (34), comparing it with at least one specified or specifiable oscillator voltage reference value and, if a first comparison criterion is satisfied, outputting a modulation isolating signal (80) to the modulation signal isolating element (61).

18 Claims, 5 Drawing Sheets

OSCILLATOR FOR A POWDER SPRAY COATING DEVICE

RELATED APPLICATIONS

The present application is a National Phase of International Application Number PCT/US2012/024836, filed, Feb. 13, 2012, and claims priority from, German Application Number 102011004026.9, filed Feb. 14, 2011 the disclosure of which is hereby identified by reference herein in its entirety.

The present invention relates to an oscillator for providing an oscillating voltage, the oscillating voltage being delivered to a powder spray coating device.

It is known from the prior art to provide powder spraying devices, in particular spray guns and the like, for delivering a fluidized powder to an earthed surface to be coated with suitable high-voltage generators in order to impart high voltage to the coating powder that is leaving the powder spray coating device in the direction of the object to be coated.

For this purpose, a transformer and a high-voltage cascade circuit connected thereto are provided, for example, within the powder spray coating device, the high-voltage transformer initially serving for the transformation to a moderately high voltage, and a voltage multiplication subsequently being performed in the sense of a cascade by the high-voltage cascade circuit supplied with the moderately high AC voltage, generally by combining diode paths and capacitors, for every half wave of the AC voltage.

For this purpose, in the case of conventional oscillators an AC voltage is generated at their output, and is subsequently converted within the powder spray coating device by the interconnection of the high-voltage transformer and the cascade circuit into a high voltage that is subsequently intended to be imparted to the coating powder.

In order to obtain an optimum coating result, in the case of conventional oscillators the amplitude of the AC voltage generated at their output is kept within certain limits. However, it has been found that operational safety—in particular with regard to possibly required explosion protection—is not obtained here by, for example, the voltage being regulated in the conventional sense. In particular, in the case of conventional oscillators it is not ensured that, in the case of an event affecting operational safety, such as for example an abrupt or erroneous change in the oscillator voltage dropping across the high-voltage transformer of the powder spray coating device, that a voltage reduction to a safe value is possible in time.

On the basis of the problematic situation described, it is therefore the object of the present invention to develop an oscillator for providing an oscillating voltage for a powder spray coating device of the type mentioned at the beginning in such a way that operational safety is improved.

This object is achieved in the case of an oscillator for providing an oscillating voltage for a powder spray coating device of the type mentioned at the beginning by the oscillator having a first signal generator for generating an intermediate circuit voltage and a second signal generator for generating a modulation signal as well as a modulation unit for generating an oscillator voltage, a first terminal for outputting the generated oscillator voltage to a powder spray coating device and a second terminal for returning this used oscillator voltage to a reference potential being provided, and a modulation signal isolating element, connected to the second signal generator, and a first voltage monitoring device also being provided. The modulation unit serves here for generating the oscillator voltage by modulation of the intermediate circuit voltage with the modulation signal. The first voltage monitoring device is designed here for continuously measuring the oscillator voltage, i.e. the voltage dropping across the terminals of the powder spray coating device during operation. At the same time, the first voltage monitoring device is designed for comparing the measured values thus obtained with at least one specified or specifiable oscillator voltage reference value. The first voltage monitoring device is also designed for checking the comparative values thus obtained as to whether a first comparison criterion is satisfied and, depending on whether this first comparison criterion is satisfied, outputting a modulation isolating signal to the modulation signal isolating element. The modulation signal isolating element is incorporated here in the connection of the second signal generator to the modulation unit and serves for interrupting the electrical connection between the second signal generator and the modulation unit in the presence of a modulation isolating signal.

Satisfying the comparison criterion corresponds here to detecting the case of a fault, so that in such a case of a fault the modulation signal serving for the modulation is no longer fed to the modulation unit. The rapidly occurring switching off or isolation of the modulation signal from the modulation unit in the case of a fault means that, in such a case of a fault, there is then very quickly no longer any voltage at the first terminal of the oscillator according to the invention, as a result of which the operational safety improves significantly.

Advantageous developments of the invention are specified in the subclaims.

For example, it is provided that the oscillator has in addition to the modulation signal isolating element an intermediate circuit voltage isolating element, and that there is provided a second voltage monitoring device, which continuously measures the intermediate circuit voltage present at the modulation unit. In a similar way as in the case of the described interaction between the first voltage monitoring device and the modulation signal isolating element, the second voltage monitoring device serves here for comparing the continuously obtained measured value of the intermediate circuit voltage with an intermediate circuit voltage reference value, the intermediate circuit voltage reference value being specified or specifiable in advance. The comparison between the intermediate circuit voltage measured value and the intermediate circuit voltage reference value can be used to derive a second comparison criterion, satisfying which has the effect that an intermediate circuit voltage isolating signal is output to the intermediate circuit voltage isolating element. The intermediate circuit voltage isolating element is thereby switched into the signal path between the first signal generator and the modulation unit and is designed to isolate the first signal generator from the modulation unit when an intermediate circuit voltage isolating signal is present at a corresponding input of the intermediate circuit voltage isolating element.

The second comparison criterion may in this case correspond in particular to a detected fault in the generation of the intermediate circuit voltage. In particular in the case when the first signal generator has a first pulse-width modulation unit, this pulse-width modulation serves for allowing the thus generated intermediate circuit voltage to be set or specified between a minimum value and a maximum value. This may be required in particular if the oscillator voltage, and consequently also the high voltage generated within the powder spray coating device, is to be limited to a certain value, for example in the case of the high voltage to 100 kV. Malfunctioning of the first signal generator, for example in the case of failure of the pulse-width modulation, may in such a case result in an excessively high intermediate circuit voltage, consequently also in an excessively high oscillator voltage, adversely affecting safety. Such a fault can be detected by the second voltage monitoring device in conjunction with the intermediate circuit voltage isolating element and be converted into a comparison criterion, whereby the intermediate circuit voltage isolating element isolates the modulation unit from the intermediate circuit voltage. The rapidly possible switching-off capability means that in such a case of a fault no voltage, or only a very minimal voltage, drops off between the first terminal and the second terminal, whereby the operational safety is further improved.

It may also be provided that the at least one specified or specifiable oscillator voltage reference value is an oscillator voltage maximum value. The first comparison criterion would be satisfied here whenever the actually measured oscillator voltage exceeds this oscillator voltage maximum value, it being possible for the maximum value to be a maximum amplitude value, but also a maximum frequency value of the oscillator voltage.

It may also be envisaged to provide in addition to the oscillator voltage maximum value, or exclusively as the oscillator voltage reference value, an oscillator voltage minimum value. Once again, the term "minimum value" in this connection means a lowering of the amplitude of the oscillator voltage and equally a possible lowering of the frequency of the oscillator voltage below a minimum value.

In a similar way, an intermediate circuit voltage maximum value may be specified as an intermediate circuit voltage reference value, although a purely DC value generally exists as the intermediate circuit voltage, and consequently the second comparison criterion, which is determined by the second voltage monitoring device, is satisfied when the amplitude of the intermediate circuit voltage exceeds a maximum value.

Consequently, it may similarly be envisaged to provide in addition to the intermediate circuit voltage maximum value, or exclusively as the intermediate circuit voltage reference value, an intermediate circuit voltage minimum value, the satisfying of the second comparison criterion once again relating to a falling of the amplitude of the intermediate circuit voltage below a minimum value.

In an advantageous way, to ensure a switching-off operation that is as quick as possible, it may be envisaged to form the modulation signal isolating element, the intermediate circuit voltage isolating element or both the isolating elements mentioned as transistor isolating elements. Here it is particularly of advantage to provide fast-switching field-effect transistor isolating elements. The high switching speed here allows rapid switching off to be ensured, which further improves the operational safety.

For a particularly effective and simple structure, it is provided in a particularly advantageous way that the transistor isolating element has a transistor driver and a transistor activated by means of the transistor driver. The use of a transistor driver, in particular and preferably a transistor driver block with a logical isolating signal terminal, allows the effect to be achieved here that switching off of the transistor can take place very quickly and easily when the transistor driver receives an isolating signal. In this case, the conduction of the transistor, that is in the case of a field-effect transistor the source-drain path, is interrupted. Particularly of advantage here is the use of a transistor driver block that has a logically inverted deactivation input. This means that such a driver allows operation of the transistor precisely when there is a signal at logical 1 ("high") at the logically inverted input, and then performs switching off when the signal at the input falls to logical 0 ("low"). This ensures that, in the case of failure of the voltage monitoring device assigned to the respective driver, that is to say the first or second voltage monitoring device, the transistor does not remain switched on or conducting, but instead switching off takes place (self-safety).

In a particularly advantageous way, it may be envisaged to integrate the first signal generator and the first voltage monitoring device in a first processor unit. The first signal generator then also serves for generating the intermediate circuit voltage and the integrated first voltage monitoring device monitors the oscillator voltage. While saving a separate component for the first voltage monitoring device, the oscillator voltage is then monitored, with a second signal generator that is isolated from the first processor unit being checked by monitoring the oscillator voltage for malfunctioning, and the modulation signal isolating element that is connected to its output being switched off in the case of a fault.

In addition to an integration of the first signal generator and the first voltage monitoring device in a first processor unit, or exclusively, it may be envisaged to integrate the second signal generator and the second voltage monitoring device in a second processor unit. The monitoring of the intermediate circuit voltage that is generated by the first signal generator with a second voltage monitoring device, integrated in the second processor unit, consequently makes possible—once again while saving a component—a monitoring of the intermediate circuit voltage that is generated independently of this second processor unit. In the case of detection of a fault, i.e. if the second comparison criterion is satisfied, the intermediate circuit voltage isolating element that is connected to the first signal generator is interrupted, and consequently the conduction of the intermediate circuit voltage to the modulation unit is isolated.

In particular when an integration of the first signal generator and the first voltage monitoring device in a first processor unit and at the same time an integration of the second signal generator and the second voltage monitoring device in a second processor unit are used, relatively simple and effective mutual monitoring, that is in graphic terms "crosswise", is consequently possible, whereby the operational safety is again improved.

It may additionally be provided that the oscillator also has an earth current monitoring device. Such an earth current monitoring device is connected both to the reference potential of the oscillator and to a protective conductor potential or earth potential, the object to be coated, to which coating powder is applied by means of the powder spray coating device, also being at earth potential. A charge carrier transfer via the powder cloud during spraying then produces an earth current flow between the reference potential of the oscillator and the earth potential. The earth current monitoring device is designed for continuously measuring this earth current and generating an earth current monitoring isolating signal if a previously specified or specifiable maximum earth current is exceeded. This earth current monitoring isolating signal is output to the modulation signal isolating element, to the intermediate circuit voltage isolating element or to both the isolating elements mentioned, so that, even when it is established that a maximum earth current is exceeded, a switching off that increases safety can take place irrespective of the behavior of the voltage profiles monitored by means of the first voltage monitoring device and the second voltage monitoring device.

Finally, it may also be envisaged to couple the oscillator voltage capacitively to the first terminal for delivering the oscillator voltage.

Four preferred exemplary embodiments of the oscillator according to the invention for providing an oscillating voltage for a powder spray coating device are explained in more detail below on the basis of a drawing, in which.

Figure 1:
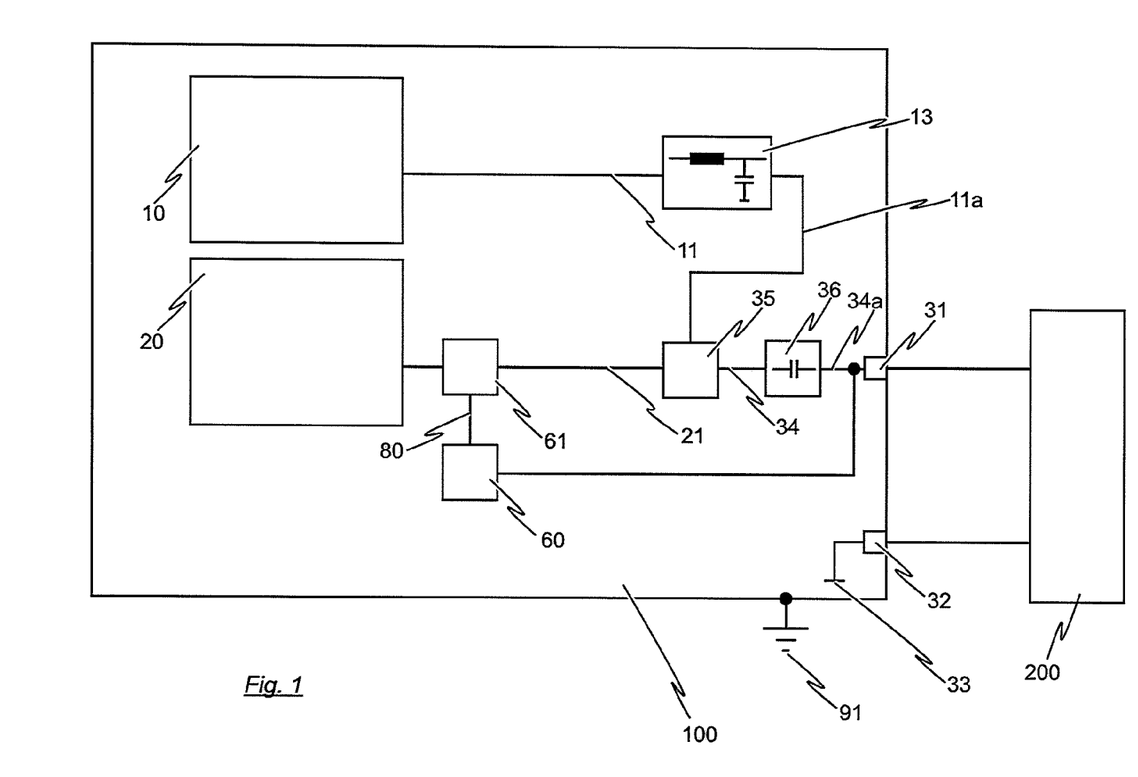
FIG. 1 shows a block diagram of a first embodiment of the oscillator according to the invention with a first voltage monitoring device and a modulation signal isolating element.

FIG. 1 shows a block diagram of a first exemplary embodiment of the oscillator 100 according to the invention for providing an oscillating voltage for a powder spray coating device 200, the powder spray coating device 200 having a high-voltage transformer (not represented) and a high-voltage cascade (likewise not represented). The primary winding of the high-voltage transformer is connected by way of schematically indicated supply lines between a first terminal 31 and a second terminal 32, at reference potential 33, of the oscillator 100.

The oscillator 100 has a first signal generator 10 and a second signal generator 20. An intermediate circuit voltage 11 is generated by means of the first signal generator 10, a low-pass filter 13 being used for smoothing the intermediate circuit voltage 11, in particular whenever pulse-width modulation is used, so that at the output of this low-pass filter 13 there is a low-pass-filtered intermediate circuit voltage 11a, which is substantially a smoothed DC voltage. The second signal generator generates a modulation signal 21, which is generally likewise obtained by means of pulse-width modulation within the second signal generator 20. The modulation signal 21 is passed to the modulation input of a modulation unit 35 with a modulation signal isolating element 61 interposed. The low-pass-filtered intermediate circuit voltage 11a is likewise at the modulation unit 35 and is modulated with the modulation signal 21. The resultant oscillator voltage 34 is fed to a coupling capacitance 36, in order to eliminate the DC voltage component or DC offset thereof, and the capacitively coupled oscillator voltage 34a thus obtained is supplied to the first terminal 31 for outputting the oscillator voltage. The dropping voltage is picked off between the coupling capacitance 36 and the first terminal 31 and supplied to a first voltage monitoring device 60. This first voltage monitoring device 60 is designed for continuously measuring the thus picked-off oscillator voltage 34 or capacitively coupled oscillator voltage 34a and comparing it with a specified or specifiable oscillator voltage reference value. If a first comparison criterion is satisfied, the first voltage monitoring device 60 outputs a modulation isolating signal 80 to the modulation signal isolating element 61, so that, given such a first comparison criterion, which corresponds to the case of a fault, the modulation signal isolating element interrupts the connection of the second signal generator 20 to the modulation unit 35.

The designations used in the exemplary embodiments described below represent elements that are the same or have the same effect with reference to the first exemplary embodiment according to FIG. 1.

Figure 2:
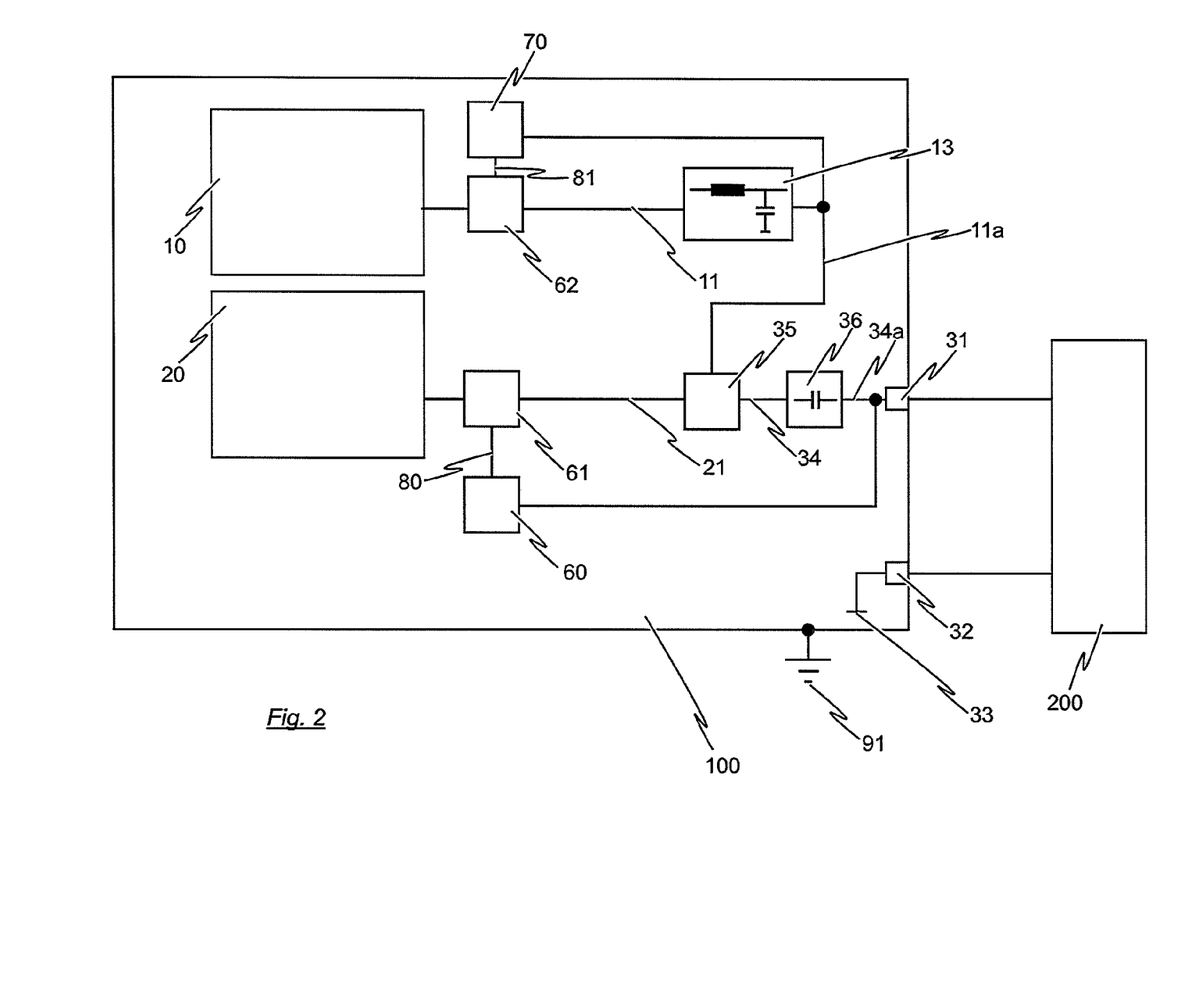
FIG. 2 shows an oscillator according to the invention in a second embodiment similar to the first embodiment in FIG. 1, with additionally a second voltage monitoring device and an intermediate circuit voltage isolating element.

An oscillator according to the invention as provided by the second exemplary embodiment, as shown in FIG. 2, is constructed in a way similar to the first exemplary embodiment that can be seen in FIG. 1, but here an intermediate circuit voltage isolating element 62 is additionally provided in the path of the line between the first signal generator 10 and the low-pass filter 13. Of course, it is also possible to arrange this intermediate circuit voltage isolating element 62 only downstream of the low-pass filter. Furthermore, the second exemplary embodiment in FIG. 2 provides a second voltage monitoring device 70, which picks off the intermediate circuit voltage 11, or in the exemplary embodiment represented the low-pass-filtered intermediate circuit voltage 11a, and continuously measures its value. Furthermore, the second voltage monitoring device 70 serves the purpose of comparing this continuously measured intermediate circuit voltage value with a specified or specifiable intermediate circuit voltage reference value and deriving from this comparison whether or not a second comparison criterion is given. If such a second comparison criterion is detected as satisfied, which corresponds to the case of a fault, an isolating signal (81) is output to the intermediate circuit voltage isolating element (62) connected to the second voltage monitoring device 70.

Figure 3:
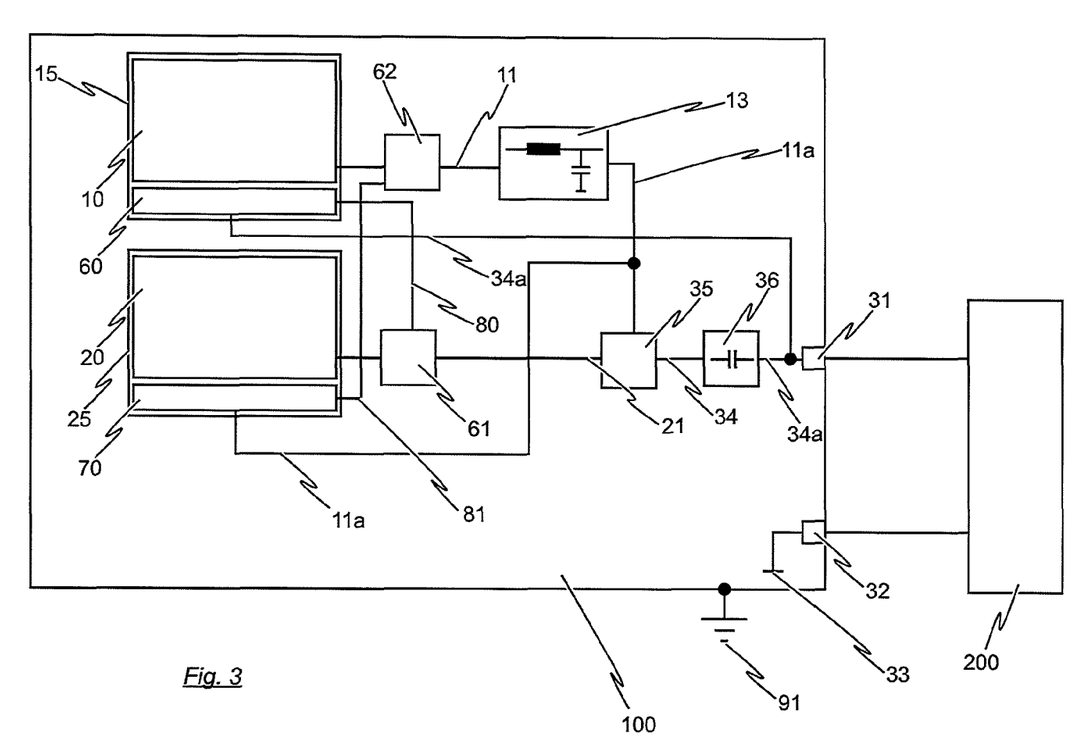
FIG. 3 shows an oscillator according to the invention as provided by a third embodiment, similar to the second exemplary embodiment in FIG. 2, although here the voltage monitoring devices and the signal generators are respectively integrated in processor units.

As can be seen from FIG. 3, it is envisaged according to a third exemplary embodiment not to provide the first voltage monitoring device 60 and the second voltage monitoring device 70 as separate components, but to integrate them together with the corresponding signal generators in processor units. Thus, the first signal generator 10 and the first voltage monitoring device 60 are combined in a first processor unit 15; correspondingly, the second signal generator 20 and the second voltage monitoring device 70 are combined in a second processor unit 25. By this arrangement according to the third exemplary embodiment, the first processor unit 15 generates the intermediate circuit voltage 11, monitors the oscillator voltage 34 or 34a largely influenced by the second processor unit and, if a comparison criterion is satisfied, i.e. if it is detected that there is a fault, outputs a modulation isolating signal 80 to the modulation signal isolating element 61 in order to isolate the modulation signal 21 from the modulation unit 35.

A corresponding integration of the second signal generator 20 and the second voltage monitoring device 70 in the second processor unit 25 achieves the effect that the intermediate circuit voltage 11 or 11a that is then monitored by the second processor unit 25 and is largely influenced by the first processor unit 15 is isolated from the modulation unit 35 by delivering an intermediate circuit voltage isolating signal 81 to the intermediate circuit voltage isolating element 62.

The first processor unit 15 thereby monitors the voltage influenced by the second processor unit 25 and, conversely, the second processor unit 25 monitors the voltage generated by the first processor unit 15 and, as and when required, delivers a corresponding isolating command or an isolating signal. It is thereby ensured that, even in the case of failure of one of the two processor units 15, 25, the other one respectively ensures that the operational safety is improved.

Figure 4:
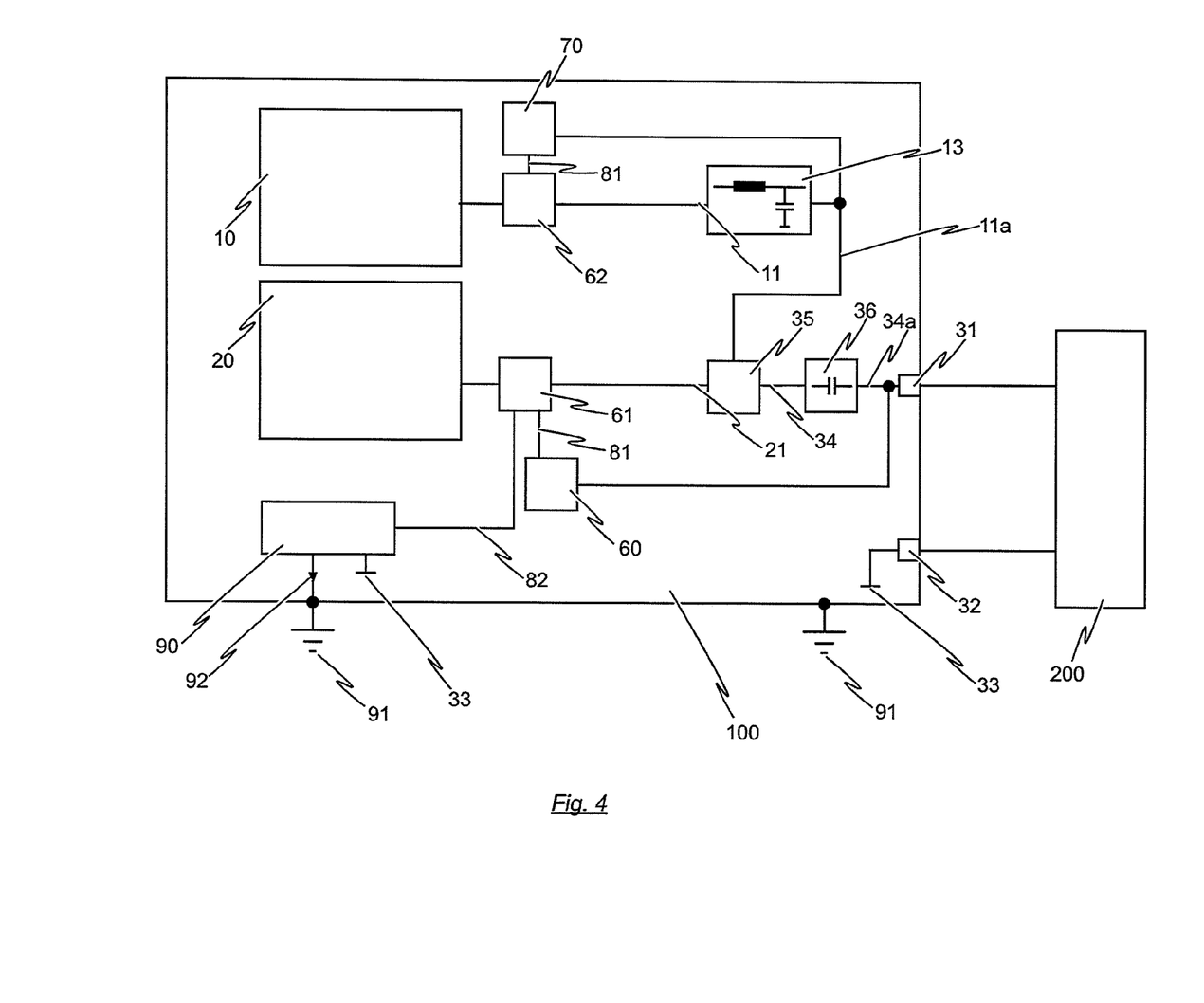
FIG. 4 shows an oscillator according to the invention as provided by a fourth embodiment, similar to the second exemplary embodiment according to FIG. 2, with an additional earth current monitoring device.

In the fourth exemplary embodiment of the oscillator according to the invention, represented according to FIG. 4, an earth current monitoring device 90 is provided in addition to the components represented in the second exemplary embodiment according to FIG. 2.

The earth current monitoring device 90 has in this case an electrical connection both to the reference potential 32 and to a protective conductor or earth potential 91 and serves for measuring and monitoring during the coating operation by means of the powder spray coating device 200 current flowing via the powder cloud in the transfer of the powder particles to the earthed object to be coated (not represented). If the earth current monitoring device 90 establishes during the continuous measuring and comparison operation that a previously specified or specifiable maximum earth current is exceeded, the earth current monitoring device (90) is designed for delivering an earth current monitoring isolating signal (82). This earth current monitoring isolating signal (82) may be supplied to the modulation signal isolating element (61) alone, the intermediate circuit voltage isolating element (62) alone or both to the modulation signal isolating element (61) and to the intermediate circuit voltage isolating element (62). If it is therefore established by the earth current monitoring device (90) that such a specified or specifiable maximum earth current is exceeded, which corresponds to a fault, rapid potential isolation of the first terminal 31 for outputting an oscillator voltage 34 is achieved, which once again improves the operational safety of the oscillator according to the invention.

It is of course also possible, however, to integrate the earth current monitoring device 90 at least partially in a possible first processor unit 15 or second processor unit 25.

Figure 5:
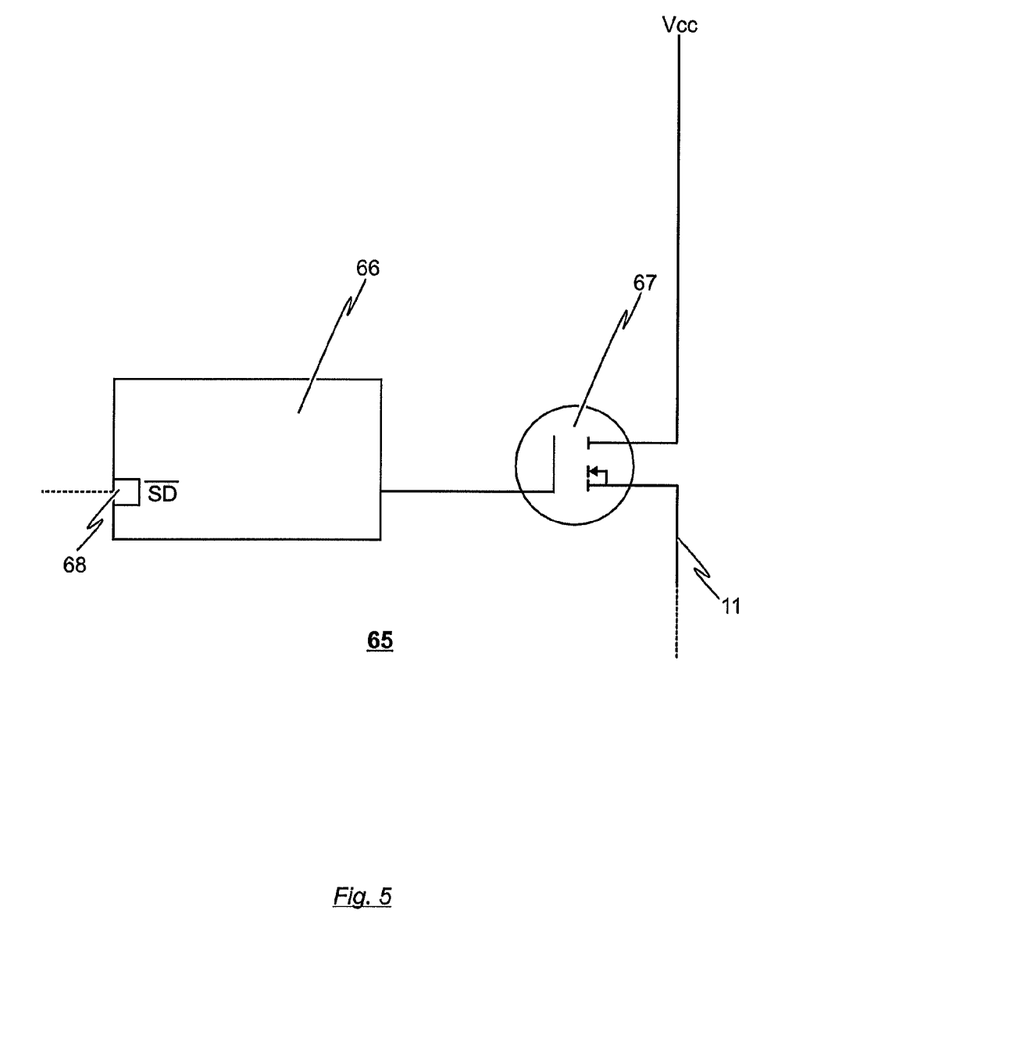
FIG. 5 shows a transistor isolating element with a transistor driver and a field-effect transistor.

Finally, represented in FIG. 5 is a transistor isolating element 65, as can advantageously be used. The transistor isolating element 65 may, in particular, describe the structure of the modulation signal isolating element 61 and the intermediate circuit voltage isolating element 62. The transistor isolating element 65 according to FIG. 5 consists here of a transistor driver 66 and a transistor 67, in the case represented a field-effect transistor. The transistor driver 66 has here an isolating signal terminal 68, which receives a logically inverted switch-off signal or shutdown signal. Further terminals (not represented in FIG. 5), which serve for the modulation of the transistor input, that is to say in the example represented the gate terminal, are provided on the transistor driver 66.

When the voltage at the isolating signal terminal 68 drops to logical 0 ("low"), the conduction of the transistor 67 is thereby interrupted. In the example represented according to FIG. 5, in the case of such a transistor isolating element 65 the present supply voltage VCC would no longer be switched through via the source-drain path, and consequently the intermediate circuit voltage 11 would be interrupted.

At this point it should be pointed out that all of the parts described above are claimed as essential to the invention in themselves alone and in any combination, in particular the details that are represented in the drawings. Modifications thereof are familiar to a person skilled in the art.

LIST OF DESIGNATIONS 10 first signal generator
11 intermediate circuit voltage
11a low-pass-filtered intermediate circuit voltage
15 first processor unit
20 second signal generator
21 modulation signal
25 second processor unit
31 first terminal for outputting an oscillator voltage
32 second terminal for returning the used oscillator voltage to a reference potential
33 reference potential
34 oscillator voltage
34a capacitively coupled oscillator voltage
35 modulation unit
36 coupling capacitance
60 first voltage monitoring device
61 modulation signal isolating element
62 intermediate circuit voltage isolating element
65 transistor isolating element
66 transistor driver
67 transistor
68 isolating signal terminal
70 second voltage monitoring device
80 modulation isolating signal
81 intermediate circuit voltage isolating signal
82 earth current monitoring isolating signal
90 earth current monitoring device
91 protective conductor potential
92 earth current
100 oscillator
200 powder spray coating device

The invention claimed is:

1. An oscillator for providing an oscillating voltage for a powder spray coating device, the oscillator comprising:
    a first signal generator for generating an intermediate circuit voltage;
    a second signal generator for generating a modulation signal;
    a modulation unit for generating an oscillator voltage;
    a modulation signal isolating element connected to the second signal generator, the modulation signal isolating element being configured to interrupt an electrical connection between the second signal generator and the modulation unit in the presence of a modulation isolating signal;
    a first terminal for outputting the oscillator voltage to a powder spray coating device; and
    a second terminal for returning the used oscillator voltage to a reference potential, in particular earth potential,
        wherein the modulation unit being is configured for generating the oscillator voltage by modulation of the intermediate circuit voltage with the modulation signal, and wherein the oscillator further comprises a first voltage monitoring device configured for continuously measuring the oscillator voltage, comparing the oscillator voltage with at least one specified or specifiable oscillator voltage reference value and, if a first comparison criterion is satisfied, outputting a modulation isolating signal to the modulation signal isolating element.

2. An oscillator for providing an oscillating voltage for a powder spray coating device, the oscillator comprising:
    a first signal generator for generating an intermediate circuit voltage;
    a second signal generator for generating a modulation signal;
    a modulation signal isolating element, connected to the second signal generator;
    a modulation unit for generating an oscillator voltage;
    a first terminal for outputting the oscillator voltage to a powder spray coating device;
    a second terminal for returning the used oscillator voltage to a reference potential, in particular earth potential,
        wherein the modulation unit being configured for generating the oscillator voltage by modulation of the intermediate circuit voltage with the modulation signal; and
    a first voltage monitoring device configured for continuously measuring the oscillator voltage, comparing the oscillator voltage with at least one specified or specifiable oscillator voltage reference value and, if a first comparison criterion is satisfied, outputting a modulation isolating signal to the modulation signal isolating element, the oscillator also having an intermediate circuit voltage isolating element, connected to the first signal generator, and a second voltage monitoring device being provided, designed for continuously measuring the intermediate circuit voltage, comparing the intermediate circuit voltage with at least one specified or specifiable intermediate circuit voltage reference value and, if a second comparison criterion is satisfied, outputting an intermediate circuit voltage isolating signal to the intermediate circuit voltage isolating element.

3. The oscillator as claimed in claim 1,
the at least one specified or specifiable oscillator voltage reference value being a maximum oscillator voltage value and the first comparison criterion being satisfied if the maximum oscillator voltage value is exceeded.

4. The oscillator as claimed in claim 1,
the at least one specified or specifiable oscillator voltage reference value being a minimum oscillator voltage value and the first comparison criterion being satisfied if the minimum oscillator voltage value is not reached.

5. The oscillator as claimed in claim 1,
the at least one specified or specifiable intermediate circuit voltage reference value being a maximum intermediate circuit voltage value and the second comparison criterion being satisfied if the maximum intermediate circuit voltage value is exceeded.

6. The oscillator as claimed in claim 1,
the at least one specified or specifiable intermediate circuit voltage reference value being a minimum intermediate circuit voltage value and the second comparison criterion being satisfied if the minimum intermediate circuit voltage value is not reached.

7. An oscillator for providing an oscillating voltage for a powder spray coating device, the oscillator having:
a first signal generator for generating an intermediate circuit voltage;
a second signal generator for generating a modulation signal;
a modulation signal isolating element, connected to the second signal generator;
a modulation unit for generating an oscillator voltage;
a first terminal for outputting the oscillator voltage to a powder spray coating device;
a second terminal for returning the used oscillator voltage to a reference potential, in particular earth potential,
the modulation unit being designed for generating the oscillator voltage by modulation of the intermediate circuit voltage with the modulation signal; and
a first voltage monitoring device being provided, designed for continuously measuring the oscillator voltage, comparing it with at least one specified or specifiable oscillator voltage reference value and, if a first comparison criterion is satisfied, outputting a modulation isolating signal to the modulation signal isolating element,
the modulation signal isolating element and/or the intermediate circuit voltage isolating element each being formed as a transistor isolating element, in particular as a fast-switching field-effect transistor isolating element.

8. The oscillator as claimed in claim 7,
the transistor isolating element comprising a transistor driver and at least one transistor, in particular at least one field-effect transistor, and the transistor driver being configured for isolating the conduction of the transistor when an isolating signal is received.

9. The oscillator as claimed in claim 1,
the first signal generator and the first voltage monitoring device being integrated in a first processor unit.

10. The oscillator as claimed in claim 1,
the second signal generator and the second voltage monitoring device being integrated in a second processor unit.

11. An oscillator for providing an oscillating voltage for a powder spray coating device, the oscillator comprising:
a first signal generator for generating an intermediate circuit voltage;
a second signal generator for generating a modulation signal;
a modulation signal isolating element, connected to the second signal generator;
a modulation unit for generating an oscillator voltage;
a first terminal for outputting the oscillator voltage to a powder spray coating device;
a second terminal for returning the used oscillator voltage to a reference potential, in particular earth potential,
wherein the modulation unit is configured for generating the oscillator voltage by modulation of the intermediate circuit voltage with the modulation signal;
a first voltage monitoring device configured for continuously measuring the oscillator voltage, comparing the oscillator voltage with at least one specified or specifiable oscillator voltage reference value and, if a first comparison criterion is satisfied, outputting a modulation isolating signal to the modulation signal isolating element; and
an earth current monitoring device, designed for continuously measuring an earth current, in particular an earth current between the reference potential and a protective conductor potential, and outputting an earth current monitoring isolating signal to the modulation signal isolating element and/or an earth current monitoring isolating signal to the intermediate circuit voltage isolating element if a previously specified or specifiable maximum earth current is exceeded.

12. A method for providing an oscillating voltage provided at an oscillator for a powder spray coating device, the method comprising:
generating an intermediate circuit voltage by a first signal generator;
generating a modulation signal by a second signal generator;
generating an oscillator voltage by a modulation unit;
interrupting an electrical connection between the second signal generator and the modulation unit in the presence of a modulation isolating signal by a modulation signal isolating element connected to the second signal generator;
outputting the oscillator voltage to a powder spray coating device by a first terminal; and
returning the used oscillator voltage to a reference potential, in particular earth potential, by a second terminal,
wherein the modulation unit generates the oscillator voltage by modulation of the intermediate circuit voltage with the modulation signal, and
a first voltage monitoring device performs the steps of:
continuously measuring the oscillator voltage;
comparing the measured oscillator voltage with at least one specified or specifiable oscillator voltage reference value;

establishing whether or not a first comparison criterion is satisfied;

if the first comparison criterion is satisfied: outputting a modulation isolating signal to the modulation signal isolating element.

13. The oscillator as claimed in claim 8, wherein the transistor driver is a transistor driver with a logical isolating signal terminal.

14. The oscillator as claimed in claim 1, the oscillator also having an intermediate circuit voltage isolating element, connected to the first signal generator, and a second voltage monitoring device being provided, designed for continuously measuring the intermediate circuit voltage, comparing the intermediate circuit voltage with at least one specified or specifiable intermediate circuit voltage reference value and, if a second comparison criterion is satisfied, outputting an intermediate circuit voltage isolating signal to the intermediate circuit voltage isolating element.

15. The oscillator as claimed in claim 1, the modulation signal isolating element and/or the intermediate circuit voltage isolating element each being formed as a transistor isolating element, in particular as a fast-switching field-effect transistor isolating element.

16. The oscillator as claimed in claim 15, the transistor isolating element comprising a transistor driver and at least one transistor, and the transistor driver being configured for isolating the conduction of the transistor when an isolating signal is received.

17. The oscillator as claimed in claim 16, wherein the transistor driver is a transistor driver with a logical isolating signal terminal.

18. The oscillator as claimed in claim 1, further comprising an earth current monitoring device, configured for continuously measuring an earth current, in particular an earth current between the reference potential and a protective conductor potential, and outputting an earth current monitoring isolating signal to the modulation signal isolating element and/or an earth current monitoring isolating signal to the intermediate circuit voltage isolating element if a previously specified or specifiable maximum earth current is exceeded.

* * * * *